United States Patent

Shinoda et al.

(10) Patent No.: US 10,955,510 B2
(45) Date of Patent: Mar. 23, 2021

(54) MAGNETIC RESONANCE IMAGING APPARATUS

(71) Applicant: Canon Medical Systems Corporation, Otawara (JP)

(72) Inventors: Kensuke Shinoda, Otawara (JP); Yoshimori Kassai, Nasushiobara (JP); Yoshiteru Watanabe, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 6 days.

(21) Appl. No.: 16/569,316

(22) Filed: Sep. 12, 2019

(65) Prior Publication Data

US 2020/0103482 A1 Apr. 2, 2020

(30) Foreign Application Priority Data

Sep. 14, 2018 (JP) .............................. JP2018-172699

(51) Int. Cl.
| | |
|---|---|
| *G01R 33/565* | (2006.01) |
| *G01R 33/483* | (2006.01) |
| *G01R 33/46* | (2006.01) |
| *G01R 33/32* | (2006.01) |

(52) U.S. Cl.
CPC ........... *G01R 33/565* (2013.01); *G01R 33/32* (2013.01); *G01R 33/4608* (2013.01); *G01R 33/483* (2013.01)

(58) Field of Classification Search
CPC ............................ G01R 33/565; G01R 33/483; G01R 33/4608; G01R 33/32
See application file for complete search history.

(56) References Cited

U.S. PATENT DOCUMENTS 4,672,320 A * 6/1987 Sekihara ............ G01R 33/56563
324/309
6,882,151 B2 4/2005 Kiefer et al.

FOREIGN PATENT DOCUMENTS

JP 2010-119740 6/2010

* cited by examiner

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry generates, from a first image influenced by a magnetic field distortion, a second image in which the influence of the distortion is corrected, receives a first area setting in the second image and calculates, by a method of the calculation depending on an imaging purpose, an excitation area in the imaging based on the first area.

20 Claims, 7 Drawing Sheets

FIG. 1

| Imaging portion | Coefficient ($K_{pe}, K_{ro}, K_{so}$) |
|---|---|
| Head | (0.8, 0.5, 0.8) |
| Heart | (0.9, 0.8, 1.0) |
| Knee | (0.8, 0.5, ⋯) |
| Hip | (1.0, 0.4, ⋯) |
| ⋮ | ⋮ |

— LUT

MAGNETIC RESONANCE IMAGING APPARATUS

CROSS-REFERENCE TO RELATED APPLICATIONS

This application is based upon and claims the benefit of priority from Japanese Patent Application No. 2018-172699, filed Sep. 14, 2018, the entire contents of which are incorporated herein by reference.

FIELD

Embodiments described herein relate generally to a magnetic resonance imaging apparatus.

BACKGROUND

In a magnetic resonance imaging (MRI) apparatus, a distortion caused by, for example, inhomogeneity of a static magnetic field or nonlinearity of a gradient magnetic field may appear in a reconstructed image.

Normally, the MRI apparatus generates a distortion corrected image as a reconstructed image by correcting the distortion. This distortion corrected image is used as, for example, an image for diagnosis or positioning. For example, in the case of displaying an area of an imaging cross-section at a slice position positioned on a distortion corrected image on a distortion non-corrected image, which is an image before the distortion is corrected, the MRI apparatus is able to display a corresponding slice position on the distortion non-corrected image by performing an imaging cross-section correction, which is an inverse correction of a distortion correction, with respect to the area of the imaging cross-section.

In the case of setting an imaging cross-section by the positioning using a distortion corrected image, the MRI apparatus performs the same imaging cross-section correction every time with respect to an area of the set imaging cross-section regardless of the imaging condition. However, depending on the imaging condition, in some cases, the MRI apparatus may use the imaging cross-section correction that uses a method with less calculation amount.

DETAILED DESCRIPTION

In general, according to one embodiment, a magnetic resonance imaging apparatus includes processing circuitry. The processing circuitry generates, from a first image influenced by a magnetic field distortion, a second image in which the influence of the distortion is corrected, receives a first area setting in the second image and calculates, by a method of a calculation depending on an imaging purpose, an excitation area in the imaging based on the first area.

Hereinafter, embodiments of the magnetic resonance imaging apparatus will be explained in detail with reference to the accompanying drawings.

Figure 1:
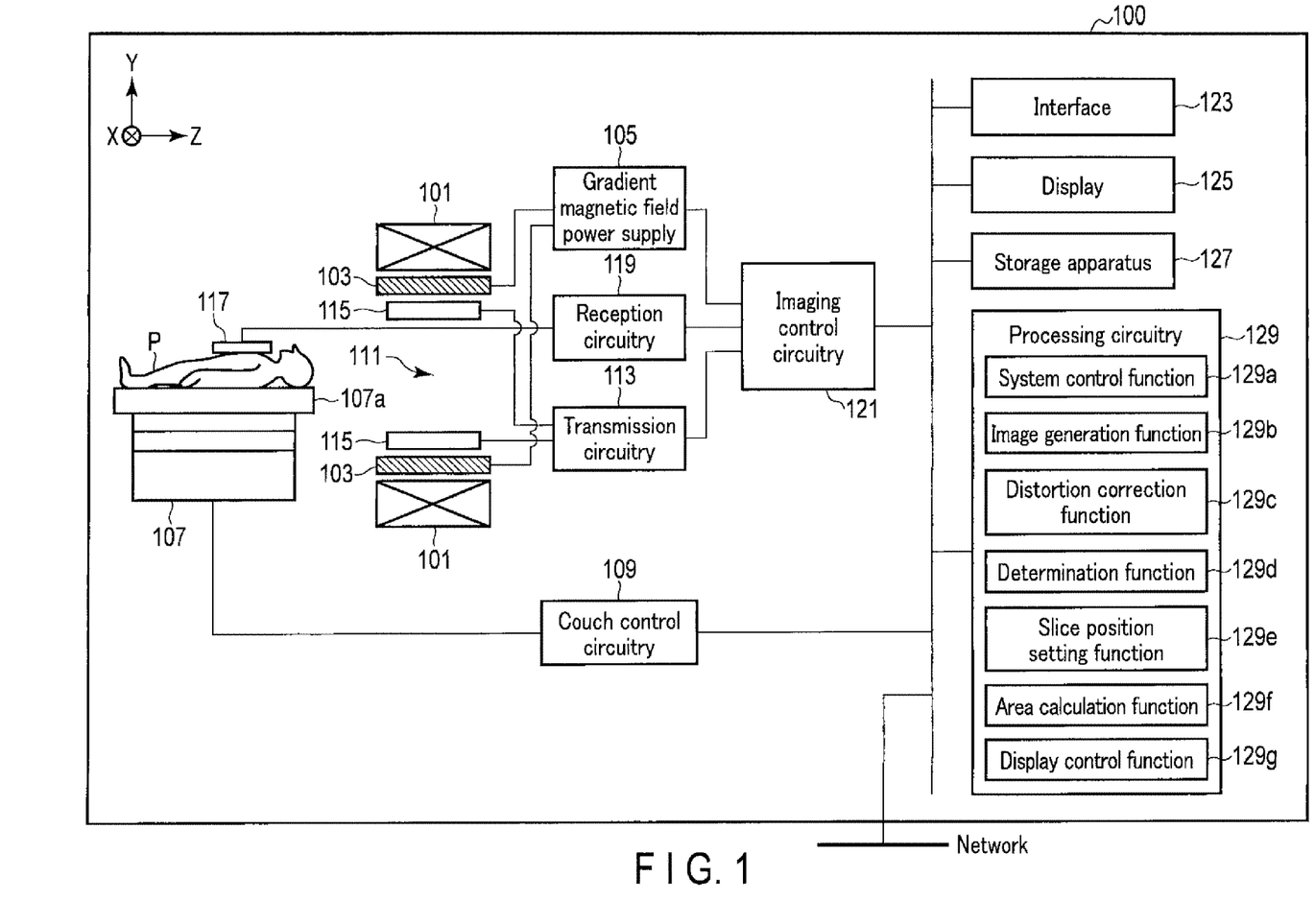
FIG. 1 is a diagram showing a configuration example of an MRI apparatus according to an embodiment.

FIG. 1 is a diagram showing a configuration example of an MRI apparatus according to an embodiment. For example, as shown in FIG. 1, an MRI apparatus 100 according to an embodiment includes a static field magnet 101, a gradient coil 103, a gradient magnetic field power supply 105, a couch 107, couch control circuitry 109, transmission circuitry 113, a transmission coil 115, a reception coil 117, reception circuitry 119, imaging control circuitry 121, an interface 123, a display 125, a storage apparatus 127, and processing circuitry 129. The MRI apparatus 100 may have a hollow cylindrical-shaped shim coil provided between the static field magnet 101 and the gradient coil 103.

The static field magnet 101 is, for example, a magnet formed hollow and substantially cylindrical. The static field magnet 101 generates a homogeneous static magnetic field in a bore 111 which is an inner space into which a subject P is inserted. For example, a superconductive magnet, etc. may be used for the static field magnet 101.

The gradient coil 103 is, for example, a coil formed hollow and substantially cylindrical. The gradient coil 103 is provided on the inner side of the static field magnet 101. The gradient coil 103 is a combination of three coils corresponding to each of X, Y, and Z-axes orthogonal to one another. The Z-axis direction is defined as the same as the orientation of the static magnetic field. In addition, the Y-axis direction is a vertical direction, and the X-axis direction is a direction perpendicular to each of the Z-axis and the Y-axis. The gradient coil 103 generates a gradient magnetic field to be superimposed onto the static magnetic field. Specifically, these three coils in the gradient coil 103 are separately supplied with a current from the gradient magnetic field power supply 105, and respectively generate gradient magnetic fields in which a magnetic field intensity changes along each of the X-, Y-, and Z-axes.

The gradient magnetic field of each of the X-, Y-, and Z-axes that is generated by the gradient coil 103 forms, for example, a gradient magnetic field for frequency encoding (also referred to as a readout gradient magnetic field), a gradient magnetic field for phase encoding, and a gradient magnetic field for slice selection. The frequency encoding gradient magnetic field is used to change the frequency of an MR signal in accordance with a spatial position. The phase encoding gradient magnetic field is used to change the phase of a magnetic resonance (hereinafter referred to as MR) signal in accordance with the spatial position. The slice selection gradient magnetic field is used to determine an imaging cross-section.

The gradient magnetic field power supply 105 is a power supply apparatus that supplies a current to the gradient coil 103 by the control of the imaging control circuitry 121.

The couch 107 is an apparatus including a couch top 107a on which the subject P is placed. The couch 107 inserts the couch top 107a on which the subject P is placed into a bore 111 under the control of the couch control circuitry 109. The couch 107 is installed in an examination room in which the MRI apparatus 100 is installed in such a manner that, for example, its longitudinal direction is parallel to the central axis of the static field magnet 101.

The couch control circuitry 109 is circuitry that controls the couch 107. The couch control circuitry 109 drives the couch 107 in accordance with a user's instruction via the interface 123 to move the couch top 107a in a longitudinal direction and a vertical direction, and, in some cases, a horizontal direction.

The transmission circuitry 113 supplies a radio frequency pulse corresponding to such as a Larmor frequency to the transmission coil 115 under the control of the imaging control circuitry 121.

The transmission coil 115 is an RF (radio frequency) coil disposed on the inner side of the gradient coil 103. The transmission coil 115 receives a radio frequency pulse from the transmission circuitry 113, and generates a transmission RF wave (RF pulse) which corresponds to a high-frequency magnetic field. The transmission coil is, for example, a whole body coil (WB coil). The WB coil may be used as a transmission/reception coil.

The reception coil 117 is an RF coil disposed on the inner side of the gradient coil 103. The reception coil 117 receives an MR signal that the high-frequency magnetic field causes the subject P to emit. The reception coil 117 outputs the received MR signal to the reception circuitry 119. The reception coil 117 is, for example, at least one coil, and typically is a coil array having one or more coil elements. In FIG. 1, the transmission coil 115 and the reception coil 117 are illustrated as separate RF coils; however, the transmission coil 115 and the reception coil 117 may be implemented as an integrated transmission/reception coil. The transmission/reception coil is, for example, a local transmission/reception RF coil, such as a head coil.

The reception circuitry 119 generates, under the control of the imaging control circuitry 121, a digital MR signal, which is digitized complex number data, based on the MR signal that is output from the reception coil 117. Specifically, the reception circuitry 119 performs various types of signal processing on the MR signal output from the reception coil 117, and then performs analog-to-digital (A/D) conversion on the data subjected to the various types of signal processing. The reception circuitry 119 samples the A/D converted data to generate the digital MR signal (hereinafter referred to as MR data). The reception circuitry 119 outputs the generated MR data to the imaging control circuitry 121.

The imaging control circuitry 121 controls the gradient magnetic field power supply 105, the transmission circuitry 113, and the reception circuitry 119, etc. in accordance with an imaging protocol output from the processing circuitry 129, and performs imaging on the subject P. The imaging protocol includes various pulse sequences corresponding to the examination. In the imaging protocol, the magnitude of the current supplied from the gradient magnetic field power supply 105 to the gradient coil 103, timing of supplying the current from the gradient magnetic field power supply 105 to the gradient coil 103, the magnitude of the radio frequency pulse supplied from the transmission circuitry 113 to the transmission coil 115, timing of supplying the radio frequency pulse from the transmission circuitry 113 to the transmission coil 115, and timing of receiving the MR signal at the reception coil 117, etc. are predetermined. The imaging control circuitry 121 is an example of an imaging unit.

The imaging control circuitry 121 may execute imaging based on, for example, a second area that is generated by an area calculation function 129f of the processing circuitry 129. The second area will be described later on.

In the present embodiment, for example, when one examination is performed, more than one imaging protocol is set. A set of imaging protocols set with respect to the examination is called an examination protocol. In one imaging protocol, for example, imaging in accordance with one pulse sequence is performed. Furthermore, in one protocol, for example, imaging in accordance with one pulse sequence and image processing using data obtained by the imaging may be performed. Furthermore, to "set an examination protocol", that is, to "set the order of imaging", may be rephrased as "establishing an examination plan" or "establishing an imaging plan", or may be simply rephrased as "establishing a plan". As for the imaging, there are various types of imaging, such as locator imaging, imaging for obtaining a T2 emphasized image, and imaging for obtaining a T1 emphasized image.

The locator imaging is imaging that acquires a positioning image that is used when setting a slice position. The positioning image is an image of, for example, a coronal cross-section, a sagittal cross-section, and an axial cross-section regarding an imaging portion. In the present embodiment, a coronal cross-section direction, a sagittal cross-section direction, and an axial cross-section direction will collectively be referred to as an imaging cross-section direction. Furthermore, "to set a slice position" may also be read as "to set a slice cross-section", "to set an imaging cross-section", or "to set a slice".

The interface 123 includes a circuit that receives various instructions and information inputs from the user. The interface 123 includes a circuit related to, for example, a pointing device such as a mouse, or an input device such as a keyboard. The circuit of the interface 123 is not limited to a circuit for physical operation members such as a mouse and a keyboard. For example, the interface 123 may include an electrical signal processing circuit which receives an electrical signal corresponding to an input operation from an external input device provided separately from the MRI apparatus 100, and outputs the received electrical signal to various circuits.

The display 125 displays various types of MR images generated by an image generation function 129b and various types of information regarding imaging and image processing, under the control of a system control function 129a in the processing circuitry 129 described later on. The display 125 is, for example, a display device, such as a CRT display, a liquid crystal display, an organic EL display, an LED display, a plasma display, or any other display or monitor known in the relevant technical field.

The storage apparatus 127 stores MR data filled in a k-space via the image generation function 129b, and image data generated by the image generation function 129b, etc. The storage apparatus 127 stores various imaging protocols, and imaging conditions including a plurality of imaging parameters defining the imaging protocol, etc. In other words, the imaging condition includes, for example, an imaging portion and a sequence type. The imaging portion is a portion on which the subject is to be imaged, such as a head, a heart, a spine (for example, a thoracolumbar spine and an entire spine), and arthrosis (shoulder, knee, hand, and foot). The sequence type is, for example, a spin echo method, a gradient echo method, a high-speed spin echo method, a high-speed gradient echo method, and echo planar imaging (EPI). The storage apparatus 127 stores programs corresponding to each function executed by the processing circuitry 129. The imaging portion may be rephrased as "purpose of imaging (imaging purpose)".

The storage apparatus 127 also stores information regarding a static magnetic field formed by the static field magnet 101, and gradient magnetic field formed by the gradient coil 103 (hereinafter referred to as "magnetic field information"). The magnetic field information includes information regarding, for example, inhomogeneity of a static magnetic field and nonlinearity of a gradient magnetic field. In the following, the inhomogeneity of the static magnetic field and the nonlinearity of the gradient magnetic field, etc. will collectively be referred to as a distortion of a magnetic field. That is, the magnetic field information is information indicating distortion of the magnetic field. The magnetic field information is acquired by, for example, measurement in advance and simulation.

Figure 2:
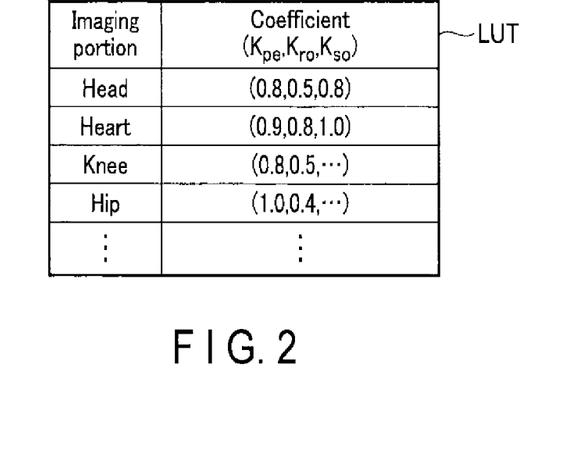
FIG. 2 is a diagram exemplifying a correspondence table in which an imaging portion and a coefficient of an imaging cross-section correction are corresponded in an embodiment.

The storage apparatus 127 also stores a correspondence table in which an imaging portion and a coefficient of an imaging cross-section correction are corresponded. FIG. 2 is a diagram exemplifying the correspondence table in which the imaging portion and the coefficient of the imaging cross-section correction are corresponded in an embodiment. For example, as shown in FIG. 2, in a correspondence table LUT, a plurality of imaging portions and a plurality of groups of coefficients are respectively corresponded. The imaging cross-section correction is processing that converts an imaging cross-section that is set on an image in which the magnetic field distortion is corrected into an imaging cross-section that is to be set in an actual imaging space in which the magnetic field distortion is present. For example, the imaging cross-section correction may also be considered as correcting the imaging cross-section that is set in an image in which the magnetic field distortion is corrected to an imaging cross-section in an image that is influenced by the magnetic field distortion. It may also be considered as performing, for example, a correction that is opposite to the magnetic field distortion correction with respect to the imaging cross-section. Since there are constraints in the imaging cross-sections that can be set in the MRI apparatus, to be precise, in some cases, a mismatch may occur in a correspondence relationship between the imaging cross-section on an image in which the magnetic field distortion is corrected and the imaging cross-section on an image that is influenced by the magnetic field distortion. Even in such case, as long as a substantial correspondence relationship is established, this means that the imaging cross-section on the image in which magnetic field distortion is corrected corresponds with the imaging cross-section on the image that is influenced by the magnetic field distortion. The coefficients are for setting the range for performing the imaging cross-section correction. As for the correspondence table LUT, a look up table may also be used. Furthermore, in the correspondence table LUT, in addition to the imaging portion and the coefficient of the imaging cross-section correction, an imaging cross-section direction may also be corresponded. Detailed explanations of the coefficient will be given later on.

The storage apparatus 127 may also store a correspondence table in which the imaging portion and a method of the imaging cross-section correction are corresponded. The storage apparatus 127 may also store a correspondence table in which a sequence type and a cross-section correction method are corresponded. Furthermore, the storage apparatus 127 may also store a correspondence table in which the imaging portion, the sequence type, and the cross-section correction method are corresponded.

The storage apparatus 127 is, for example, a semiconductor memory element, such as a random access memory (RAM) or a flash memory, a hard disk drive, a solid state drive, or an optical disk. The storage apparatus 127 may also be a driving device, etc., that reads and writes various information to and from portable storage media, such as a CD-ROM drive, a DVD drive, and a flash memory.

The processing circuitry 129 includes, as hardware resources, a processor or a memory such as a read-only memory (ROM) and a RAM (not shown) to control the MRI apparatus 100. The processing circuitry 129 includes a system control function 129*a*, an image generation function 129*b*, a distortion correction function 129*c*, a determination function 129*d*, a slice position setting function 129*e*, an area calculation function 129*f*, and a display control function 129*g*. Various functions performed by the system control function 129*a*, the image generation function 129*b*, the distortion correction function 129*c*, the determination function 129*d*, the slice position setting function 129*e*, the area calculation function 129*f*, and the display control function 129*g* are stored in the storage apparatus 127 in the form of a program executable by a computer. The processing circuitry 129 is a processor that realizes a function corresponding to each program by reading a program that corresponds to each of these functions from the storage apparatus 127 and executing it. In other words, the processing circuitry 129 which has read each program can activate each function shown in the processing circuitry 129 of FIG. 1.

FIG. 1 explains a case in which the various functions are realized in a single processing circuitry 129; however, the functions may be realized by executing a program by a plurality of independent processors. In other words, the various functions above may be configured as a program, and the single processing circuitry may execute each program, or a specific function may be implemented in dedicated independent program execution circuitry.

The term "processor" used in the above explanation means, for example, a circuit such as a central processing unit (CPU), a graphics processing unit (GPU), an application specific integrated circuit (ASIC), or a programmable logic device (for example, a simple programmable logic device (SPLD), a complex programmable logic device (CPLD), and a field programmable gate array (FPGA)).

The processor realizes the various functions by reading the program stored in the storage apparatus 127 and executing it. Instead of storing the program in the storage apparatus 127, the program may be directly embedded in the circuit of the processor. In this case, the processor realizes the function by reading and executing the program embedded in the circuit. In the same manner, the couch control circuitry 109, the transmission circuitry 113, the reception circuitry 119, and the imaging control circuitry 121, etc., are also configured by an electronic circuit such as the above-described processor. Furthermore, each of the system control function 129*a*, the image generation function 129*b*, the distortion correction function 129*c*, the determination function 129*d*, the slice position setting function 129*e*, the area calculation function 129*f*, and the display control function 129*g* included in the processing circuitry 129 is an example of a system controller, an image generation unit, a correction unit, a determination unit, a setting unit, a calculation unit, and a display controller.

The processing circuitry 129 controls the MRI apparatus by the system control function 129a. Specifically, the processing circuitry 129 reads the system control program stored in the storage apparatus 127, loads it in the memory, and controls each circuitry of the MRI apparatus 100 in accordance with the loaded system control program. For example, the processing circuitry 129 reads an imaging protocol from the storage apparatus 127 by the system control function 129a based on an imaging condition input by the user via the interface 123. The processing circuitry 129 may generate the imaging protocol based on the imaging condition. The processing circuitry 129 transmits the imaging protocol to the imaging control circuitry 121, and controls imaging on the subject P.

The processing circuitry 129 fills the MR data in the k-space by the image generation function 129b. The processing circuitry 129 generates an MR image by performing, for example, Fourier transform on the MR data filled in the k-space. The MR image corresponds to, for example, a morphological image regarding the subject P. The processing circuitry 129 outputs the MR image to the display 125 and the storage apparatus 127.

The processing circuitry 129 generates, by the distortion correction function 129c, an image in which influence of the magnetic field distortion is reduced (referred to as a second image, or a distortion corrected image) by correcting an image that is influenced by the magnetic field distortion (referred to as a first image, or a distortion non-corrected image). In other words, the processing circuitry 129 generates a distortion corrected image in which influence of distortion is corrected from a distortion non-corrected image that is influenced by the magnetic field distortion. Specifically, the processing circuitry 129 performs distortion correction processing for correcting the magnetic field distortion with respect to the MR data based on, for example, the magnetic field information stored in the storage apparatus 127.

The processing circuitry 129 determines, by the determination function 129d, a method of inverse correction regarding the magnetic field distortion based on the imaging condition. Specifically, the processing circuitry 129 may determine the method of inverse correction based on information of the imaging portion of the subject included in the imaging condition. The processing circuitry 129 may also determine the method of inverse correction based on the sequence type included in the imaging condition.

The inverse correction is synonymous with the above-mentioned imaging cross-section correction. Therefore, hereinafter, the "method of inverse correction" and the "method of imaging cross-section correction" may be interchangeably used. A specific example of the method of imaging cross-section correction will be described later on.

The processing circuitry 129 may determine by, for example, the determination function 129d a parameter regarding an area to apply the inverse correction based on an imaging portion of the subject included in the imaging condition. This parameter is, for example, the group of coefficients mentioned above. Specifically, the processing circuitry 129 may refer to, for example, the correspondence table LUT of FIG. 2 to read the coefficient corresponding to the imaging portion, and determine the read coefficient as the parameter.

In addition, the processing circuitry 129 may determine, by the determination function 129d, a parameter regarding an area to apply the inverse correction method based on a positioning image. Specifically, the processing circuitry 129 may extract an area of the imaging portion from the positioning image by performing area segmentation processing with respect to the positioning image, and determine a coefficient that indicates a ratio of the imaging portion with respect to the positioning image as the parameter.

The processing circuitry 129 sets a first area in the distortion corrected image by the slice position setting function 129e. Specifically, the processing circuitry 129 sets a slice position on the distortion corrected image by, for example, the user's instruction via the input interface 123. In other words, the processing circuitry 129 receives the setting of the slice position on the distortion corrected image. Furthermore, for example, in the case where a region of interest is set by the user's instruction via the interface 123, the processing circuitry 129 restricts the user's operation so that the region of interest is not set to a portion where the first area cannot be set in the distortion corrected image. To restrict the user's operation means to disable a pointer to be moved on the above portion in the case where, for example, the user sets the region of interest using a pointing device.

The processing circuitry 129 generates, by the area calculation function 129f, a second area in the distortion non-corrected image by applying an inverse correction regarding a magnetic field distortion based on the imaging condition with respect to the first area set on the distortion corrected image. Specifically, for example, the processing circuitry 129 generates the second area on the distortion non-corrected image by applying the inverse correction method corresponding to the information of the imaging portion with respect to the first area on the distortion corrected image. Alternatively, the processing circuitry 129 may generate the second area on the distortion non-corrected image by applying the inverse correction method corresponding to the information of the sequence type with respect to the first area on the distortion corrected image. In other words, the processing circuitry 129 executes, by the area calculation function 129f, the processing for calculating the second area on the distortion non-corrected image corresponding to the first area by changing the imaging conditions. That is to further say that, the processing circuitry 129 calculates the second area (excitation area) in the imaging based on the first area, in a method of a calculation depending on the imaging purpose. The processing circuitry 129 calculates the excitation area based on, for example, the first area by changing at least one parameter from among the position, the tilt, and the size of the first area.

The processing circuitry 129 generates, by the area calculation function 129f, the second area by applying an imaging cross-section correction method with respect to the set slice position. Alternatively, the processing circuitry 129 may generate the second area by applying the imaging cross-section correction method and the parameter with respect to the set slice position.

There are several kinds of imaging cross-section correction methods, in which each of the calculation amounts differ. In this method, for example, at least one parameter from among the position, the tilt, and the size of the first area is changed. As a method with small calculation amount, there is, for example, a method that focuses on the migration of a center position of the first area, and generates the second area by translationally moving the FOV (or slab) in the same size as the first area by the migration distance of the center position. Furthermore, as a method with large calculation amount, there is, for example, a method that focuses on the migration of positions of all of the vertexes of the first area, and generates the second area by approximating an area having a distorted shape formed by vertexes after migration (hereinafter referred to as a distortion solid) to a cube. In the following, each of the methods will be explained in detail.

Figure 3:
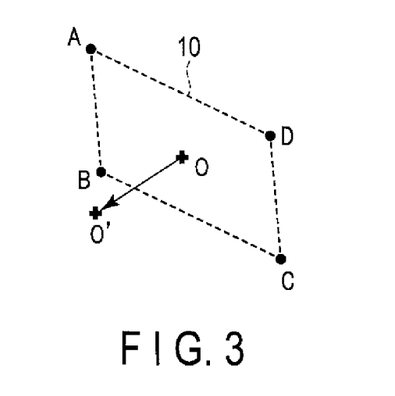
FIG. 3 is a diagram explaining a method in which importance is placed on an FOV center position of an imaging cross-section correction in an embodiment.

FIG. 3 is a diagram explaining a method in which importance is placed on an FOV center position of an imaging cross-section correction in an embodiment. For example, as shown in FIG. 3, a first area 10 corresponds to, for example, a slice that does not have thickness, and is a planar area that is obtained by joining the vertexes A, B, C, and D. For example, a line segment AD corresponds to a slice position on the positioning image.

The processing circuitry 129 calculates a center position O from each vertex of the first area 10. Subsequently, the processing circuitry 129 calculates a center position O' before the distortion correction from the center position O after the distortion correction based on the magnetic field information stored in the storage apparatus 127. The processing circuitry 129 then generates the second area having the same FOV as the first area 10, and that is based on a center position O'. The second area that is based on the center position O' is generated by, for example, translationally moving the first area 10.

That is, the processing circuitry 129 generates the second area by translationally moving the first area 10. Furthermore, when generating the second area, the processing circuitry 129 uses an inverse correction method based on a position regarding the first area. Specifically, the processing circuitry 129 uses an inverse correction method based on a center position of the first area.

In the case where the first area is a slab having thickness, the processing circuitry 129 should calculate the center position from each vertex (eight vertexes) of the first area, and generate the second area in the same manner as the above.

Figure 4:
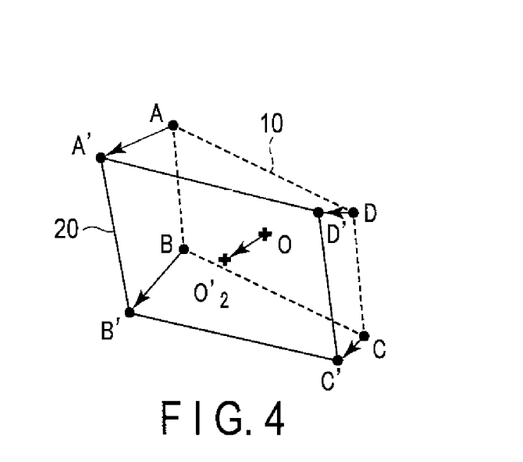
FIG. 4 is a diagram explaining a method in which importance is placed on an FOV center position of an imaging cross-section correction in an embodiment.

FIG. 4 is a diagram explaining a method in which importance is placed an FOV center position of an imaging cross-section correction in an embodiment. For example, as shown in FIG. 4, a provisional second area 20 corresponds to, for example, a slice that does not have thickness, and is a planar area that is obtained by joining the vertexes A', B', C', and D'.

The processing circuitry 129 calculates each vertex of the provisional second area 20 before the distortion correction from each vertex of the first area 10 after the distortion correction based on the magnetic field information stored in the storage apparatus 127. Subsequently, the processing circuitry 129 calculates the center position O' from each vertex of the provisional second area 20. The processing circuitry 129 then generates the second area having the same FOV as the first area 10, and that is based on a center position O'$_2$.

The second area that is based on the center position O'$_2$ is generated by, for example, translationally moving the first area 10. Alternatively, the second area is generated by, for example, rotating the first area 10. Alternatively, the second area is generated by, for example, translationally moving and rotating of the first area 10.

That is, the processing circuitry 129 generates the second area by either translationally moving or rotating the first area 10. Furthermore, when generating the second area, the processing circuitry 129 uses an inverse correction method based on a position regarding the first area. Specifically, the processing circuitry 129 uses an inverse correction method based on the position of each vertex of the first area.

In the case where the first area is a slab having thickness, the processing circuitry 129 should calculate each vertex (eight vertexes) of the provisional second area from each vertex (eight vertexes) of the first area, and generate the second area in the same manner as the above.

Figure 5:
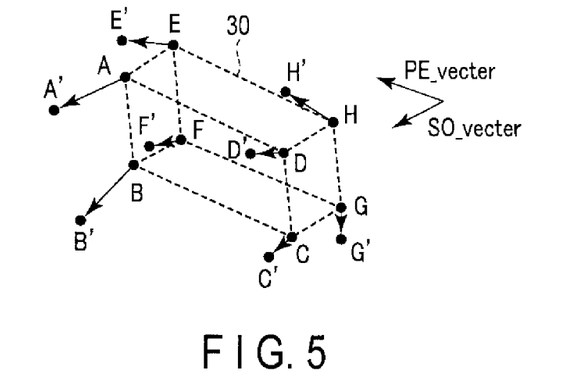
FIG. 5 is a diagram explaining a method in which importance is placed on reappearance of a slice volume of an imaging cross-section correction in an embodiment.
Figure 6:
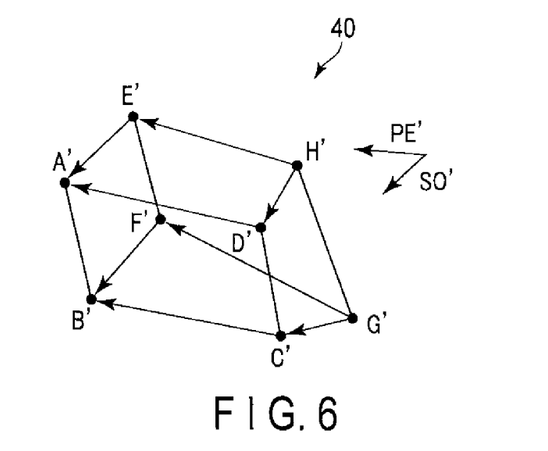
FIG. 6 is a diagram explaining a method in which importance is placed on reappearance of a slice volume of an imaging cross-section correction in an embodiment.

FIG. 5 and FIG. 6 are diagrams explaining a method in which importance is placed on reappearance of a slice volume of an imaging cross-section correction in an embodiment. For example, as shown in FIG. 5, a first area 30 corresponds to, for example, a slab having thickness, and is a cubic area that is obtained by joining vertexes A, B, C, D, E, F, G, and H. SO_vector indicates a slice order (SO) direction of the first area 30. PE_vector indicates a phase encode (PE) direction of the first area 30.

Furthermore, as shown in FIG. 6, a provisional second area 40 is a cubic area that is obtained by joining vertexes A', B', C', D', E', F', G', and H' that are calculated based on the first area 30. SO' indicates a unit vector of an SO direction of the provisional second area 40. PE' indicates a unit vector of a PE direction of the provisional second area 40.

Since the provisional second area 40 is a distortion solid, SO' and PE' are calculated by using, for example, the following formulas (1) and (2).

$$SO'=\text{Normalize}(\text{Sum}(E'A',F'B',G'C',H'D')) \quad (1)$$

$$PE'=\text{Normalize}(\text{Project}(\text{Sum}(D'A',C'B',G'F',H'E'))) \quad (2)$$

Sum ( ) on the right side of formula (1) is a function that calculates the sum inside the parentheses, and, specifically, calculates the sum of each direction vector. Normalize ( ) is a function that normalizes the numerical values inside the parentheses, and normalizes the summed direction vectors. Project ( ) on the right side of formula (2) is a function that calculates a vector in an orthogonal direction with respect to a reference vector, and, for example, uses a Gram-Schmidt orthonormalization process.

Furthermore, with the center position of the first area 30 as a reference, a migration distance from the center position of the first area 30 to the center position of the provisional second area 40 is calculated using, for example, the following formula (3).

$$\text{Offset}'=\text{Average}(A',B',C',D',E',F',G',H') \quad (3)$$

Average ( ) on the right side of formula (3) is a function that calculates an average inside the parentheses, and, specifically, calculates the center position of the provisional second area 40 which is a distortion solid.

The processing circuitry 129 calculates each vertex of the provisional second area 40 before the distortion correction from each vertex of the first area 30 after the distortion correction based on the magnetic field information stored in the storage apparatus 127. Subsequently, the processing circuitry 129 calculates the unit vector SO' in the SO direction of the provisional second area 40, the unit vector PE' in the PE direction of the provisional second area 40, and the migration distance Offset' of the center position. The processing circuitry 129 then generates the second area based on the first area 30 by using the SO', the PE', and the Offset'. That is, the processing circuitry 129 generates the second area by translationally moving and rotating the first area 30.

Here, in the case where the correction is to be made by focusing on the imaging portion in the first area 30, each vertex may be reduced to match the area to be corrected by using, for example, the following formula (4).

$$\text{Point} = \text{OffsetVector} + (\text{PE\_vector}) * \text{PE\_FOV}/2 * K_{pe} + (\text{RO\_vector}) * \text{RO\_FOV}/2 * K_{ro} + (\text{SO\_vector}) * \text{SO\_FOV}/2 * K_{so} \quad (4)$$

The Offset Vector on the right side of formula (4) is, for example, a vector from the center position of the first area 30 to each vertex. PE_FOV is an FOV size in the PE direction. $K_{pe}$ is a coefficient indicating a ratio with respect to the FOV size in the PE direction. RO_FOV is an FOV size in a read out (RO) direction. $K_{ro}$ is a coefficient indicating a ratio with respect to the FOV size in the RO direction. SO_FOV is an FOV size in the SO direction. $K_{so}$ is a coefficient indicating a ratio with respect to the FOV size in the SO direction.

Each of the coefficients $K_{pe}$, $K_{ro}$, and $K_{so}$ above is a coefficient for weighting; that is, each coefficient is a parameter regarding an area to which the imaging cross-section correction method is to be applied. These parameters are set by a user or preset. For example, in the case where the vicinity of the FOV center is to be focused, the user sets the value of each of the coefficients small. Furthermore, in the case where the concordance rate of the entire volume is to be focused, the user sets the value of each of the coefficients large. In the case where the center slice is to be focused, the user sets the value of $K_{so}$ small. Therefore, the processing circuitry 129 can change the area to which the imaging cross-section correction method is to be applied based on the imaging portion.

In the case where, for example, the range with respect to the FOV is to be narrowed, each of the above coefficients is set in the range of 0.0 to 1.0; however, it is not limited thereto. In the case where, for example, the range with respect to the FOV is to be widened, each of the above coefficients may be set to a value that is larger than 1.0.

Figure 7:
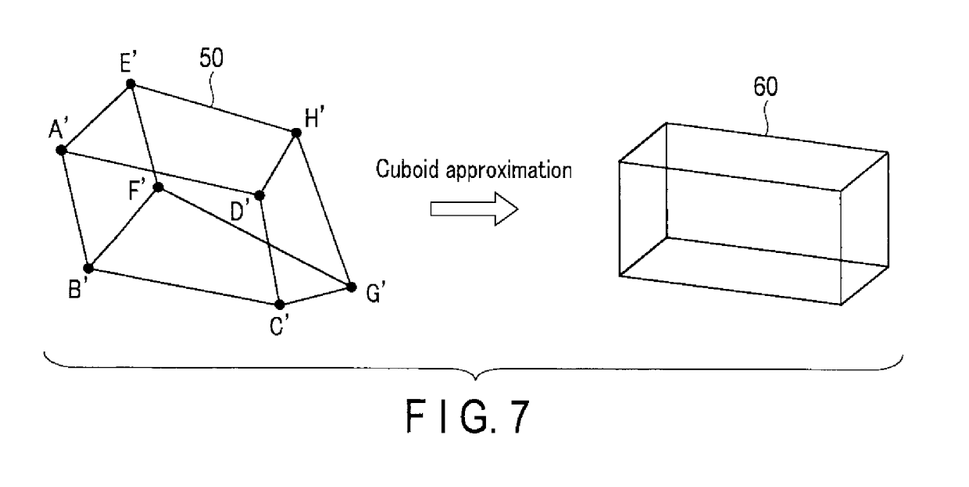
FIG. 7 is a diagram explaining a cuboid approximation of a distortion solid in a method of an imaging cross-section correction in an embodiment.

FIG. 7 is a diagram explaining a cuboid approximation of a distortion solid in an imaging cross-section correction method in an embodiment. For example, as shown in FIG. 7, a provisional second area 50 is a cubic area that is obtained by joining vertexes A', B', C', D', E', F', G', and H'. A second area 60 is an area obtained by performing a cuboid approximation with respect to the provisional second area 50.

The processing circuitry 129 generates the second area 60 by performing inverse correction with respect to the provisional second area 50 by using the cuboid approximation. Specifically, the processing circuitry 129 generates the second area that corresponds to a cuboid that contains the entire provisional second area which is a distortion solid. Alternatively, the processing circuitry 129 generates the cuboid second area so that the concordance rate with the volume of the second area that is a distortion solid becomes the highest.

Figure 8:
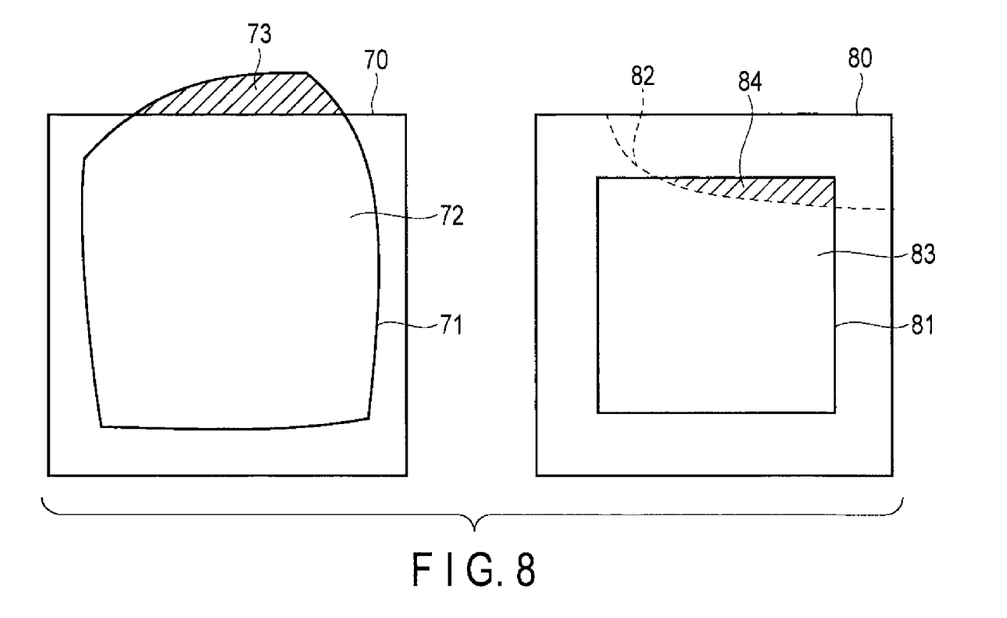
FIG. 8 is a diagram exemplifying a border line superimposed on a positioning image in an embodiment.

The processing circuitry 129 displays, by the display control function 129g, various warnings, etc. that occur during processing of each of the functions, or during operation of the user on the display 125. For example, the processing circuitry 129 performs superimposed display of an area border line on the positioning image. FIG. 8 is a diagram exemplifying a border line superimposed on a positioning image in an embodiment. For example, as shown in FIG. 8, the processing circuitry 129 generates a distortion corrected image 80 (a second image) by performing distortion correction on a distortion non-corrected image 70 (a first image).

The distortion non-corrected image 70 displays a part of an imaging portion 71 before distortion correction. The imaging portion 71 includes an area 72 included in the distortion non-corrected image 70 and an area 73 that is not included in the distortion non-corrected image 70.

The distortion corrected image 80 displays an imaging portion 81 after the distortion correction. With a border line 82 in-between, the imaging portion 81 includes a first portion 83 that corresponds to the area 72, and a second portion 84 that corresponds to the area 73.

Here, in the case of setting the first area in the second portion 84 of the distortion corrected image 80, the processing circuitry 129 would set the second area to the area 73. That is, since at least a part of the set second area would be positioned in an area outside the distortion non-corrected image 70, the user would not be able to confirm the second area when the distortion non-corrected image 70 is displayed.

Therefore, the processing circuitry 129 may superimpose the border line 82 indicating the border between the first portion 83 in which the first area can be set and the second portion 84 in which the first region cannot be set in the distortion corrected image 80, and display this on the display 125 by the display control function 129g.

For example, in the case where the region of interest is set in the second portion 84, the processing circuitry 129 may display a warning on the display 125 indicating that the region of interest has crossed the border line 82. As an example of not allowing the region of interest to be set, the processing circuitry 129 may restrict the user's operation so that the region of interest is not set in the second portion 84 by the slice position setting function 129e.

In the case where the imaging portion that can be displayed on the distortion corrected image protrudes from the imaging field of view and is generated, the processing circuitry 129 may display on the display 125 a warning indicating that the imaging portion protrudes from the imaging field of view by the display control function 129g.

In the case where a slice width of the second area exceeds a threshold value, the processing circuitry 129 may display a warning on the display 125 prompting to change the slice width by the display control function 129g.

In the case where the slice width of the second area exceeds the threshold value, the processing circuitry 129 may display on the display 125 a warning prompting to move the couch 107 (or the couch top 107a) by the display control function 129g.

In the case where the slice width of the second area is below the threshold value or exceeds the threshold value, the processing circuitry 129 may display on the display 125 a suggestion for changing the inverse correction method (the imaging cross-section correction method) by the display control function 129g.

In the case where an imaging protocol is to be changed in an examination plan, the processing circuitry 129 may display on the display 125 a suggestion for changing the inverse correction method (the imaging cross-section correction method) by the display control function 129g.

In the case where the imaging purpose is for measuring, such as for biopsy, the processing circuitry 129 may display on the display 125 a suggestion on whether or not to perform the inverse correction by the display control function 129g.

(First Processing Example)

Figure 9:
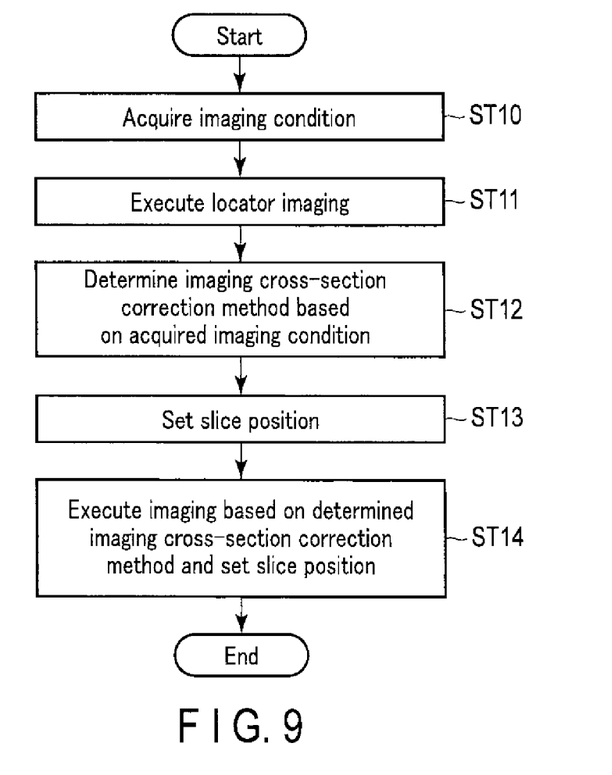
FIG. 9 is a flowchart exemplifying processing that is executed in processing circuitry in an embodiment.

FIG. 9 is a flowchart exemplifying processing that is executed in the processing circuitry in an embodiment. The processing in FIG. 9 starts by the processing circuitry 129 executing a program for determining the imaging cross-section correction method, with an imaging condition input from the interface 123 by a user, etc. serving as a trigger.

(Step ST10)

The processing circuitry 129 acquires an imaging condition by the system control function 129a. The processing circuitry 129 outputs an imaging protocol (or an examination protocol) relating to the imaging condition to the imaging control circuitry 121.

(Step ST11)

The imaging control circuitry 121 executes locator imaging based on the imaging protocol. The processing circuitry 129 then generates a distortion corrected image with respect to data acquired by the locator imaging by the image generation function 129b and the distortion correction function 129c.

(Step ST12)

The processing circuitry 129 determines, by the determination function 129d, the imaging cross-section correction method based on the acquired imaging condition.

For example, the processing circuitry 129 determines a method of inverse correction based on at least one of an imaging portion of a subject included in the imaging condition or the sequence type.

(Step ST13)

The processing circuitry 129 sets a slice position by the slice position setting function 129e. Specifically, the processing circuitry 129 sets the slice position on the distortion corrected image by, for example, the user's instruction via the input interface 123.

(Step ST14)

The imaging control circuitry 121 executes imaging based on the determined imaging cross-section correction method and the set slice position. Specifically, the processing circuitry 129 determines, by the area calculation function 129f, a second area on a distortion non-corrected image by applying the determined imaging cross-section correction method with respect to the set slice position. The imaging control circuitry 121 executes imaging based on the second area. After step ST14, the processing is ended.

(Second Processing Example)

Figure 10:
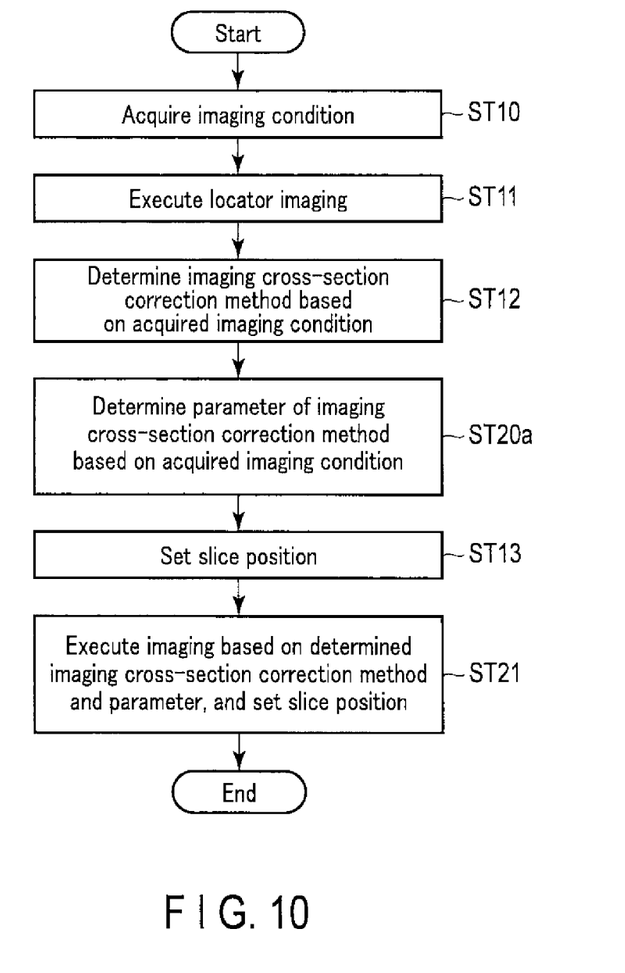
FIG. 10 is a flowchart exemplifying processing that is executed in processing circuitry in an embodiment.

FIG. 10 is a flowchart exemplifying processing that is executed in the processing circuitry in an embodiment. The processing in FIG. 10 is different from the processing in FIG. 9 in that processing for determining a parameter of the imaging cross-section correction method is added. In FIG. 10, after step ST12, the processing proceeds to step ST20a. Since the explanations of the processing from step ST10 to step ST12 and the processing of step ST13 overlap with the above explanations, explanations thereof will be omitted.

(Step ST20a)

The processing circuitry 129 determines, by the determination function 129d, the parameter of the imaging cross-section correction method based on the acquired imaging condition. For example, the processing circuitry 129 determines the parameter based on the imaging portion of the subject included in the imaging condition. More specifically, for example, in the case where the imaging portion is a "head", the processing circuitry 129 determines coefficients $(K_{pe}, K_{ro}, K_{so})=(0.8, 0.5, 0.8)$ by referring to the correspondence table LUT in FIG. 2. After step ST20a, the processing proceeds to step ST13 and step ST21.

(Step ST21)

The imaging control circuitry 121 executes imaging based on the determined imaging cross-section correction method and parameter, and the set slice position.

Specifically, the processing circuitry 129 determines, by the area calculation function 129f, the second area on the distortion non-corrected image by applying the determined imaging cross-section correction method and parameter with respect to the set slice position. The imaging control circuitry 121 executes imaging based on the second area. After step ST21, the processing in FIG. 10 is ended.

(Third Processing Example)

Figure 11:
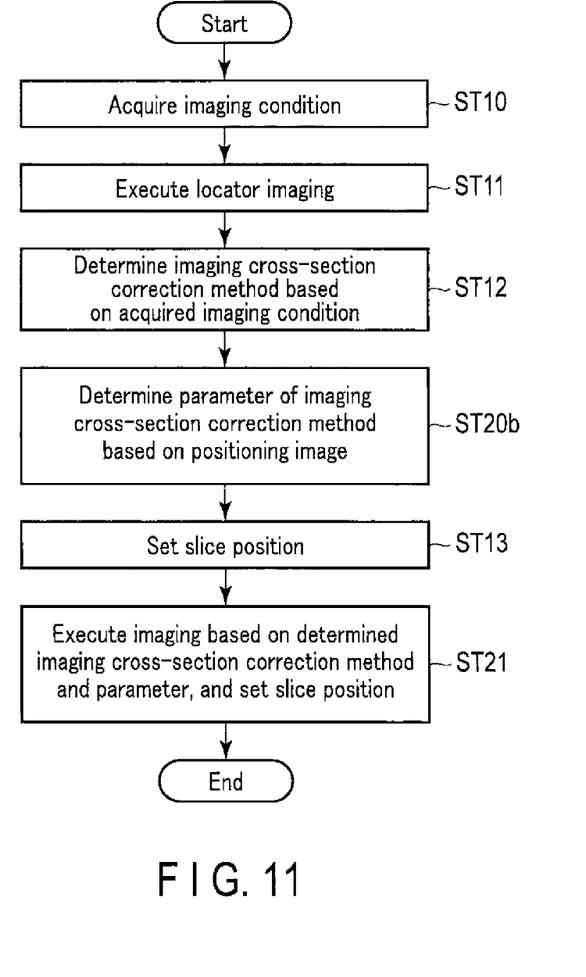
FIG. 11 is a flowchart exemplifying processing that is executed in processing circuitry in an embodiment.

FIG. 11 is a flowchart exemplifying processing that is executed in the processing circuitry in an embodiment. The processing in FIG. 11 differs from the processing in FIG. 10 in that the parameter of the imaging cross-section correction is determined based on a positioning image. Specifically, in FIG. 11, instead of the processing of step ST20a in FIG. 10, processing of step ST20b is performed.

(Step ST20b)

The processing circuitry 129 determines, by the determination function 129d, a parameter of the imaging cross-section correction method based on the positioning image. For example, the processing circuitry 129 extracts an area of the imaging portion from the positioning image by performing area segmentation processing with respect to a distortion corrected image, which is the positioning image, and determines a coefficient that indicates a ratio of the imaging portion with respect to the distortion corrected image as the parameter. After step ST20b, the processing proceeds to step ST13.

(Fourth Processing Example)

Figure 12:
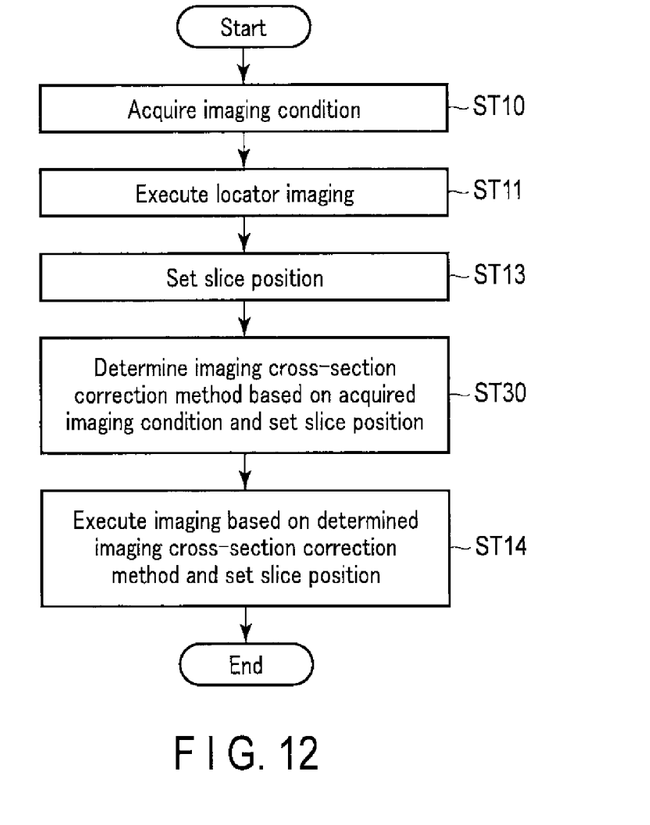
FIG. 12 is a flowchart exemplifying processing that is executed in processing circuitry in an embodiment.

FIG. 12 is a flowchart exemplifying processing that is executed in the processing circuitry in an embodiment. The processing in FIG. 12 differs from the processing in FIG. 9 to FIG. 11 in that the imaging cross-section correction method is determined based on an imaging condition and, furthermore, a slice position. In FIG. 12, step ST12 is omitted, and the processing proceeds to step ST13 after step ST11. In addition, in FIG. 12, after step ST13, the processing proceeds to step ST30. Since the explanations of the processing from step ST10 to step ST11 overlap with the above explanations, the explanations thereof will be omitted.

(Step ST30)

The processing circuitry 129 determines, by the determination function 129d, the imaging cross-section correction method based on the acquired imaging condition and the set slice position. For example, the processing circuitry 129 determines a method of inverse correction based on at least one of an imaging portion of a subject included in the imaging condition or the sequence type, and the set slice position. After step ST30, the processing proceeds to step ST14.

(Step ST14)

The imaging control circuitry 121 executes imaging based on the determined imaging cross-section correction method and the set slice position. Specifically, the processing circuitry 129 determines, by the area calculation function 129f, a second area on a distortion non-corrected image by applying the determined imaging cross-section correction method with respect to the set slice position. The imaging control circuitry 121 executes imaging based on the second area. After step ST14, the processing in FIG. 12 is ended.

The processing in FIG. 12 may also include processing that determines a parameter of the imaging cross-section correction method.

As explained above, according to an embodiment, the MRI apparatus generates, from a distortion non-corrected image (a first image) which is influenced by a magnetic field distortion, a distortion corrected image (a second image), in which the influence of the magnetic field distortion is corrected, and sets a first area in the distortion corrected image. Furthermore, the MRI apparatus executes the processing for calculating the second area on the distortion corrected image that corresponds to the first area by changing the processing depending on the imaging condition. Accordingly, since the MRI apparatus can perform the processing depending on the influence of the magnetic field distortion, the MRI apparatus can perform an optimal imaging cross-section correction based on the imaging condition.

Furthermore, according to an embodiment, the MRI apparatus executes imaging based on the second area in the distortion non-corrected image. According to an embodiment, the MRI apparatus generates the second area by applying the inverse correction method corresponded to the imaging portion information of the subject with respect to the first area in the distortion non-corrected image. According to an embodiment, the MRI apparatus generates the second area by applying the inverse correction method corresponded to the information of the sequence type with respect to the first area.

According to an embodiment, the MRI apparatus superimposes a border line indicating a border between the first portion in which the first area is settable and the second portion in which the first area is unsettable with respect to the distortion corrected image, and displays it on the display. According to an embodiment, in the case where a region of interest is set in the second portion, the MRI apparatus displays a warning on the display that the region of interest has crossed the border line.

Furthermore, according to an embodiment, the MRI apparatus restricts the user's operation so that the region of interest cannot be set in the second portion. According to an embodiment, in the case where the imaging portion that can be displayed on the distortion corrected image protrudes from the imaging field of view and is generated, the MRI apparatus displays on the display a warning indicating that the imaging portion protrudes from the imaging field of view.

Furthermore, according to an embodiment, in the case where the slice width of the second area exceeds the threshold value, the MRI apparatus displays on the display a warning prompting to move the couch. According to an embodiment, in the case where the slice width of the second area is below the threshold value or exceeds the threshold value, the MRI apparatus displays on the display a suggestion for changing the inverse correction method.

Furthermore, according to an embodiment, the MRI apparatus determines the inverse correction method regarding the distortion based on the imaging condition. According to an embodiment, the MRI apparatus generates the second area by translationally moving the first area. According to an embodiment, the MRI apparatus generates the second area by rotating the first area.

Furthermore, according to an embodiment, the MRI apparatus uses an inverse correction method that is based on a position regarding the first area. According to an embodiment, the MRI apparatus uses an inverse correction method that is based on a center position of the first area. According to an embodiment, the MRI apparatus uses an inverse correction method that is based on each vertex of the first area. According to an embodiment, in the case where the first area is a slab having thickness, the MRI apparatus performs an inverse correction by further using a cuboid approximation.

Furthermore, according to an embodiment, the MRI apparatus uses a parameter regarding an area to which the method regarding the first area is applied based on the imaging portion.

According to at least an embodiment explained above, the MRI apparatus can perform an optimal imaging cross-section correction based on the imaging condition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
processing circuitry configured to:
generate, from a first image influenced by a magnetic field distortion, a second image in which the influence of the distortion is corrected;
receive a first area setting in the second image; and
calculate, by a method of a calculation depending on an imaging purpose, an excitation area in an imaging based on the first area.

2. The apparatus according to claim 1, wherein the imaging purpose is information of a portion of a subject to be imaged.

3. The apparatus according to claim 1, wherein the processing circuitry is further configured to calculate the excitation area based on the first area by changing at least one parameter among a position, a tilt, and a size of the first area.

4. The apparatus according to claim 1, wherein the processing circuitry is further configured to execute imaging based on the excitation area.

5. The apparatus according to claim 1, wherein the imaging purpose is information of a portion of a subject to be imaged, and
wherein the processing circuitry is further configured to calculate the excitation area based on the first area by applying the method of the calculation corresponded to the information of the portion of the subject to be imaged.

6. The apparatus according to claim 1, wherein the imaging purpose is information of a sequence type, and
wherein the processing circuitry is further configured to calculate the excitation area based on the first area by applying the method of the calculation corresponded to the information of the sequence type.

7. The apparatus according to claim 1, wherein the processing circuitry is further configured to superimpose a border line on the second image and display the second image, the border line indicating a border between a first portion and a second portion, the first portion being in which the first area can be set, and the second portion being in which the first area cannot be set.

8. The apparatus according to claim 7, wherein, in the case where a region of interest is set in the second portion, the processing circuitry is further configured to display a warning on a display that the region of interest has crossed the border line.

9. The apparatus according to claim 7, wherein the processing circuitry is further configured to restrict a user's operation so that a region of interest cannot be set in the second portion.

10. The apparatus according to claim 1, wherein, in the case where an imaging portion that can be displayed in the second image is generated in a manner protruding from an imaging field of view, the processing circuitry is further configured to display a warning indicating that the imaging portion is to protrude from the imaging field of view.

11. The apparatus according to claim 1, wherein, in the case where a slice width of the excitation area exceeds a threshold value, the processing circuitry is further configured to display on a display a warning prompting to move a couch.

12. The apparatus according to claim 1, wherein, in the case where a slice width of the excitation area is below or exceeds a threshold value, the processing circuitry is further configured to display on a display a suggestion to change the method of the calculation.

13. The apparatus according to claim 1, wherein the processing circuitry is further configured to determine the method of the calculation regarding the distortion based on the imaging purpose.

14. The apparatus according to claim 1, wherein the processing circuitry is further configured to generate the excitation area by translationally moving the first area.

15. The apparatus according to claim 1, wherein the processing circuitry is further configured to generate the excitation area by rotating the first area.

16. The apparatus according to claim 1, wherein the method of the calculation is based on a position regarding the first area.

17. The apparatus according to claim 16, wherein the method of the calculation is based on a center position of the first area.

18. The apparatus according to claim 16, wherein the method of the calculation is based on a position of each vertex of the first area.

19. The apparatus according to claim 16, wherein, in the case where the first area is a slab having thickness, the method of the calculation further includes a cuboid approximation.

20. The apparatus according to claim 16, wherein an area in which the method of the calculation is to be applied changes based on a portion of a subject to be imaged.

* * * * *